Sept. 6, 1960 W. H. JONES ET AL 2,951,980

CONTROLLABLE SIGNAL TRANSMISSION NETWORK

Filed April 29, 1957

INVENTORS:
JOHN P. COSTAS,
WILLIAM H. JONES,

BY Richard V. Lang
THEIR ATTORNEY.

United States Patent Office 2,951,980

Patented Sept. 6, 1960

2,951,980

CONTROLLABLE SIGNAL TRANSMISSION NETWORK

William H. Jones, Baldwinsville, and John P. Costas, Fayetteville, N.Y., assignors to General Electric Company, a corporation of New York Filed Apr. 29, 1957, Ser. No. 655,717

7 Claims. (Cl. 323—16)

The present invention relates to a signal transmission network and more particularly to a signal transmission network whose transfer function may be controlled by an applied voltage.

Signal transmission networks whose transfer functions may be controlled by an applied voltage are required in many kinds of transmission systems. One very common task to which such networks are assigned is that of producing an output signal of constant amplitude in the presence of large fluctuations in the amplitude of an input signal. Such a task is that required of the automatic gain control circuit in a conventional amplitude modulation receiver. Typically, the automatic gain control circuit employs a number of variable-mu pentodes operating at radio frequencies for signal amplification whose mu (or gain) is controlled by adjustment of the magnitude of a control voltage to which the signal grids are returned. When it is desired to produce an output signal of relatively fixed magnitude, the magnitude of the control voltage is made to increase as the magnitude of the applied signal becomes stronger and the control voltage is applied in such sense as to reduce the mu of pentode. By controlling stages having a large amount of maximum amplification, one can obtain substantial constancy in the magnitude of an output signal against a large variation in signal amplitude.

The above described method of control is usually confined to radio frequency amplification stages. In audio amplifier circuits, multiple element tubes, including those which possess the variable mu characteristic, tend to be microphonic and to introduce hum when operated at low signal levels. The limitations thus imposed generally rule out the possibility of deriving a large amount of gain control in audio portions of a receiving circuit.

The present invention provides a superior solution to the gain stabilization problem in an environment where the above noted methods have proven unsatisfactory. The synchronous detection type receiver provides one such environment. In a synchronous detection receiver there is usually very little radio frequency amplification in advance of the detection stage, and the principal amplification occurs after the signal has been detected.

The invention, however, is of general application, and its simplicity commends it to use over a wide frequency spectrum including both audio and radio frequencies. The present invention performs the gain control function in a manner which is in many ways superior to pre-existing circuits, and is greatly simplified from those in general use. While the advantages of applicant's circuit will be adverted to throughout the course of the present application, one may be here briefly observe that with respect to the above noted objections, applicant's invention has been found in audio applications to be operable at low audio signal levels while being singularly free from problems of hum and microphonics. In radio frequency applications, wide ranges of control are also available with like circuit simplicity.

Accordingly, it is an object of the present invention to provide an improved signal transmission network whose transfer function may be controlled by an applied voltage.

It is a further object of the present invention to provide an improved audio frequency signal transmission network whose transfer function may be controlled by an applied direct voltage.

It is an additional object of the present invention to provide an improved audio signal transmission network whose transfer function may be controlled by an applied voltage, which transmission network is adapted for use with low intensity audio signals.

These and other objects of the present invention are achieved in applicant's novel voltage controlled signal transmission network by use of a first and second rectifying device each exhibiting a non-linear conduction characteristic. The input signal is supplied to the rectifying devices in series and the output signal is derived by means coupled across one of these devices. Gain control is achieved by controlling the ratio between the average potential difference across one of the rectifying devices relative to the average potential difference applied across the other device.

In accordance with a more specific feature of the present invention, it has been found that certain advantages arise in operation of the rectifying devices in the region of near zero potential. In this general region many rectifiers, including thermionic rectifiers and semiconductor rectifiers, exhibit rather striking non-linearity characteristics, giving rise to substantial gain control sensitivity, as will subsequently appear.

In addition, it is generally preferable to operate in the negative-measured bias portion of this region. This portion is that in which the voltages measured at the rectifier electrodes is negative (or reverse), but of insufficient magnitude to prevent current flow in the normal direction. Selection of a slightly negative operating point, permits the circuit to be a high impedance circuit requiring little control power.

The features of the invention which are believed to be novel are set forth with particularity in the appended claims. The invention itself, however, both as to its organization and method of operation, together with further objects and advantages thereof may best be understood by reference to the following description when taken in connection with the drawings wherein:

Figures 1, 2:
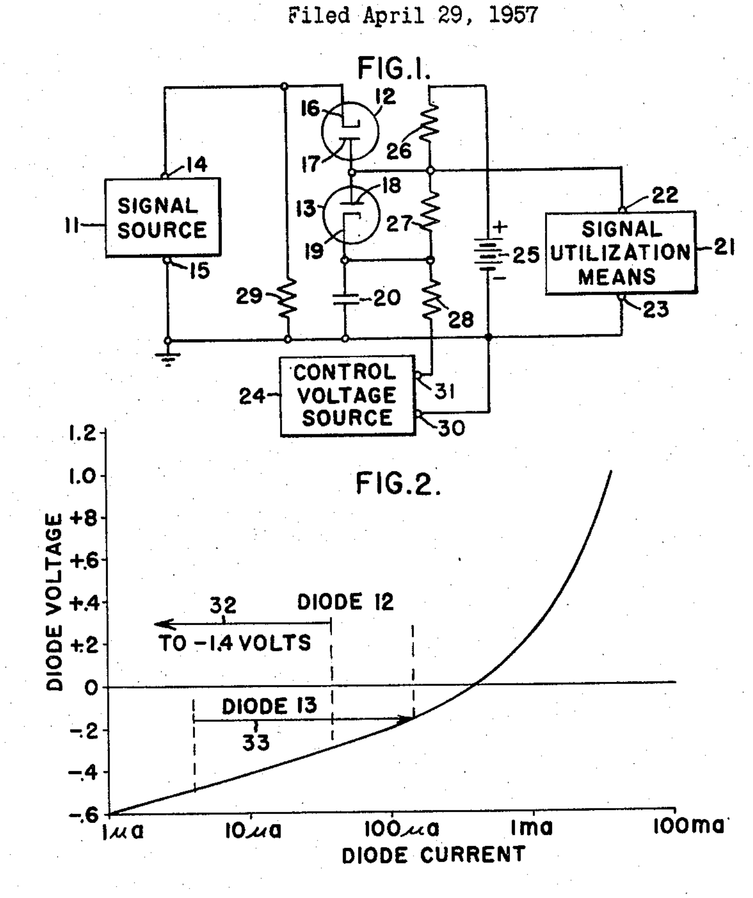
Figure 1 illustrates a first embodiment of the present invention, employing thermionic rectifiers.
Figure 2 is a graph explanatory of the method of operation of the embodiment illustrated in Figure 1.

An illustrative example of applicant's novel voltage control signal transmission network is shown in Figure 1.

The signal input circuit comprises a signal source 11, a first diode rectifier 12 and a second diode rectifier 13. The signal source is provided with two terminals 14 and 15 and may be assumed to offer infinite impedance between its terminals to direct voltage. The signal source terminal 14 is coupled to a cathode 16 of the first diode rectifier. The anodes of the two rectifiers 12 and 13, numbered respectively 17 and 18 are coupled together. The cathode 19 of the second diode 13 is coupled to ground through a capacitor 20 having a low impedance for signal voltages. The other terminal 15 of the signal source 11 is coupled to ground, thereby completing the signal input circuit through diodes 12 and 13.

The signal output circuit includes the signal utilization means 21 having its first output terminal 22 coupled to the junction of the anodes 17 and 18 and its other terminal 23 coupled to ground. The utilization device 22 also presents an open circuit from the direct current standpoint.

The above signal input and signal output circuits provide for application of the signal voltage across the diodes 12 and 13 in series, the diodes being poled for input current conduction in opposite directions with respect to one another and the signal output voltage is derived across the terminals of one of these two diodes. If one considers the diodes 12 and 13 as resistive devices, one may explain the circuit as a kind of voltage divider in which less than unitary voltage divisions can be achieved.

In accordance with the invention, additional means are provided for controlling the effective incremental resistances of the diodes 12 and 13 and thereby controlling the voltage division ratio. The elements which enter particularly into the transfer function control circuit include the control voltage source 24, the source of bias potentials 25, the resistances 26, 27, 28 and 29. The source 24 of control voltage is adapted to provide a control voltage of negative polarity with respect to its one grounded terminal 30. The other terminal 31 of the control voltage source is coupled to one terminal of the resistance 28. The other terminal of resistance 28 is connected to cathode 19 of the second diode rectifier 13. The resistance 27 has one terminal connected to the terminal of resistance 28 coupled to the cathode 19, and its other terminal connected to the common anode junction. The resistance 26 has one terminal connected to the common anode junction and its other terminal connected to the positive terminal of the source 25. The negative terminal of the source 25 is connected to ground. The resistance 29 is coupled between the cathode 16 and ground.

The control of the signal voltage division ratio may now be considered. The resistances 26, 27 and 28 provide a voltage divider having one end terminal connected to the positive terminal of the source 25 and the other end terminal connected to a source of variable negative voltage 24. Thus, the two taps on the voltage divider comprising resistances 26, 27 and 28 effectively control the potential difference across the diode 13, and the absolute anode potential of the diode 12. Since the resistance 29 couples the cathode of the diode 12 to ground, the potential difference across diode 12 is likewise controlled by the divider.

Let us now consider qualitatively, the effect upon the circuit when one depresses the control voltage to a more negative value. Let us also discount the effect which the presence of the diodes has on the voltage distribution. When this occurs, the current which flows through the three resistors, 26, 27 and 28, will increase. As a consequence, the voltage on the anode 17 will increase in a negative direction with respect to ground potential. Since the cathode 16 of diode 12 is connected to ground through resistor 29, the net effect will be an increase in the voltage difference between cathode 16 and anode 17 of diode 12 in such a direction as to tend to reduce the current flow of diode 12. At the same time, the increased current through resistors 26, 27 and 28 which resulted from a depression of the negative potential at 31, causes an increased voltage drop across resistor 27 in such a direction as to tend to make the anode 18 of diode 13 more positive with respect to the cathode 19. This change in potential across diode 13 will result in an increase of current flow through diode 13.

The result of the changes in voltages across the diode 13 and across the diode 12 as just described brings about a change in the signal voltage division ratio of the circuit. This arises from the non-linearity of the diodes employed. Figure 2 shows a conductance curve of a type 6AL5 thermionic diode rectifier plotted logarithmically with respect to current. It will be noted that in the region of zero voltage, the incremental resistance of the diode changes rapidly, being lower than the incremental resistance at more negative values of diode voltage, and greater than the incremental resistance of more positive values of diode voltage.

Let us return to the situation under consideration, in which the control voltage source 24 has been energized to produce a large negative voltage, thus causing changes in the voltages across the diode 13 and across the diode 12. As previously described, it is seen that the change in voltage across the diode 13 tends to bring about a decrease in its effective incremental resistance whereas the change in voltage across diode 12 tends to bring about an increase in its incremental resistance. If a signal is applied to these diodes as shown in Figure 2, the effect of these changes in diode incremental resistance is to change the signal voltage division ratio. Thus it is seen that the voltage division ratio tends to become larger as the control voltage becomes more negative, thereby reducing the signal voltage transfer ratio.

It is contemplated that the signal voltage be applied in relatively small values. The magnitude of the signal should never be so great as to cut off the current flow in the diodes during the usual limits of the signal voltage swings. When this occurs, there is a rather sharp rise in distortion and some undesired shifts in average voltage level. Accordingly, in equipment adapted for use in high quality audio signal circuits, the maximum input signal should also be limited, to avoid undue distortion arising from signal voltage swings over too great a portion of the conduction characteristic. In general, the greater the curvature of the conduction characteristic, the less the tolerable input voltage swing.

A constructive example employing the circuit illustrated in Figure 1 was found to provide approximately 65 decibels of control action when the control voltage source went through the range of from 0 to 10 volts. The insertion loss of the network was 3.5 decibels at zero control voltage, and the distortion was small with respect to input signals below 0.5 volt. In this constructive arrangement the following circuit parameters and circuit elements were employed.

| | | |
|---|---|---|
| Rectifiers 12 and 13 | | 6AL5 |
| Capacitor 20 | microfarads | 0.05 |
| Source 25 | volts | 20 |
| Resistance 26 | megohms | 4.7 |
| Resistance 27 | do | 1.1 |
| Resistance 28 | do | 2.2 |
| Resistance 29 | do | 0.1 |

The values of the resistances and the magnitude of the voltage of the source 25 were found to influence the sensitivity of the circuit to control action. By adjustment of these parameters maximum attenuation could be achieved with from 5 to 10 volts from the control voltage source.

A preferred mode of operation of the thermionic rectifiers is one in which these rectifiers operate in the lower portion of their forward conduction curve. This is the region in which a small forward current persists in the face of an opposing bias potential. This current is usually explained as being of thermal origin. Heating of the cathode tends to increase the kinetic energy possessed by electrons in the cathode. Thus, some electrons will develop sufficient energy to break away from the cathode with sufficient momentum to reach the anode against a retarding direct potential.

The reason for selecting this region of operation is that this region is characterized by very substantial curvature and at the same time by rather low currents. Selection of a point of operation characterized by rather substantial curvature is particularly advantageous in most automatic volume control circuitry, since the region possessing greatest curvature is most sensitive to control voltage action. As indicated above, full control may only require as little as 5 volts from the control voltage source. A second advantage of operation in this region, is that demands upon the power supply capabilities of the automatic voltage control source are made minimal. With diodes, it may be noted that any appreciable positive bias will cause rather substantial current flows in the diodes and thus cause considerable loading down of the A.V.C. source. Thus, the negative bias region is to be preferred.

Referring again to applicant's Figure 2, the limits of operation of diodes 12 and 13 have been indicated upon the graph at 32 and 33 respectively. In this graph, the diode 12 operates from approximately a bias of −0.3 volts to a bias of approximately −1.4 volts. At the same time the diode 12 operates from a region of −0.5 volts to approximately −0.15 volts. In order to bring about effective control action, the conductivity of one diode is made to diminish while that of the other increases. While the bounds of operation have been indicated with respect to this illustrative arrangement, the magnitudes and circuit values will vary greatly with different types of diodes.

The arrangement illustrated in Figure 1 employs diodes which are mutually reversed with respect to the signal currents. An arrangement in which the signal currents flow through the diodes in the same sense may also be employed. Such an arrangement is shown in Figure 3.

Figure 3:
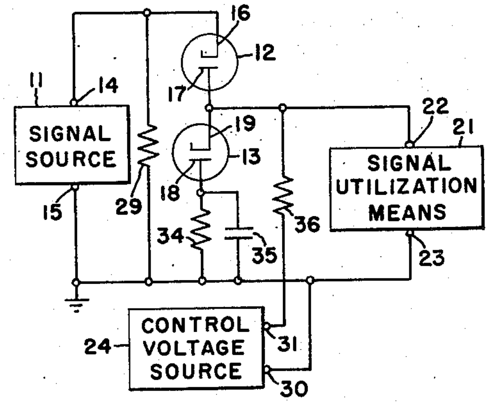
Figure 3 is a second embodiment of the present invention, also employed thermionic rectifiers.

In Figure 3 reference numerals have been repeated where they apply to the same physical element. It will be noted, however, that in Figure 3 the anode 17 of the thermionic rectifier 12 is connected to the cathode 19 of the rectifier 13. Also, the anode 18 of the rectifier 13 is returned through a resistance 34 to ground. The resistance 34 is suitably by-passed for signal voltages by a capacitor 35. The control voltage source 24 has its negative voltage output terminal 31 connected through a resistance 36 to the junction of the anode 17 and the cathode 19. This circuit does not require a separate direct voltage source. While not illustrated, it is assumed that the signal source 11 and the signal utilization means 21, as in all of the illustrative embodiments, do not provide direct current paths between external terminals.

The arrangement illustrated in Figure 3 has been found to give approximately 50 decibels of control with a control voltage of 10 volts. The range of control voltages required is appreciably dependent upon the magnitude of the resistance 34. When the resistance 34 is approximately 150,000 ohms, a range of control voltage of from 0 to 10 volts is required. If more voltage sensitive control action is desired, the resistance 34 may take a value of 1.5 megohms, which requires only 2 volts for maximum control. As before, the circuit parameters are such as to retain the diodes in the region in which forward current persists in the face of a small negative voltage bias as measured at the rectifier electrodes. As before, the control bias is applied in such a manner as to cause the conductivity of one diode to increase while that of the other diode is decreasing, thus greatly heightening the control action.

Figure 4:
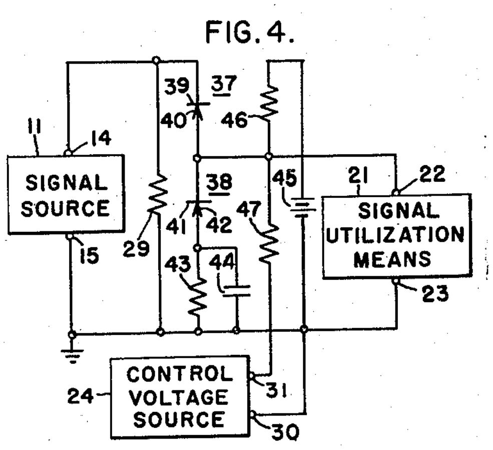
Figure 4 is a third embodiment of the present invention, employing semiconductor rectifiers.

In accordance with the invention, other types of rectifying devices may be employed. In Figure 4, application of the invention is illustrated in an embodiment employing two germanium diodes. As before, reference numerals have been repeated wherever they apply to features employed in the preceding figures. In this embodiment the diodes 37 and 38 are germanium diodes. The cathode 39 of the diode 37 is connected to the signal source terminal 14. The plate 40 of the diode 37 is connected to the cathode 41 of the diode 38. The plate 42 of the diode 38 is connected through resistance 43 to ground. The resistance 43 is by-passed with respect to alternating current voltages by capacitor 44. A source of bias potentials 45 is provided having its negative terminal connected to ground and its positive terminal connected to one terminal of the resistance 46. The other terminal of the resistance 46 is connected to the junction of the plate 40 and cathode 41 and to the terminal of a resistance 47. The remaining terminal of the resistance 47 is connected to the terminal 31 of the control voltage source.

The arrangement illustrated in Figure 4 has been found to give approximately 65 decibels of control action with a control voltage of approximately 12 volts. Illustrative circuit parameters follow:

| | |
|---|---|
| Rectifiers 37 and 38 | type 1N100 germanium diodes. |
| Resistance 29 | 100,000 ohms. |
| Resistance 43 | 330,000 ohms. |
| Capacitor 44 | 0.25 microfarad. |
| Source 45 | +10 volts. |
| Resistance 46 | 4.7 megohms. |
| Resistance 47 | 1 megohm. |

In achieving effective control action, it is desirable to operate the germanium diodes near zero bias, preferably in the negative-measured voltage bias region. Near zero bias, the germanium diodes exhibit rather substantial curvature and since the currents are relatively low with slight reverse voltages in view of the high back resistance of these devices, relatively little loading is placed upon the source of control voltage. In the arrangement just described, the diode 37 was operated from a range of approximately 0.02 volt forward bias to approximately −0.1 volt (reverse bias) while the diode 38 has an initial bias of −0.04 volt (reverse bias) and a final bias of 0.07 volt (forward bias). Through this range the control voltage was initially 0 volts and decreased to −15 volts.

Selection of the resistance 43 has appreciable control upon the linearity of the control action, a value of 100*k* giving a more nearly linear characteristic than higher values.

Germanium rectifiers and other types of semiconductor and solid state rectifiers, contrary to the vacuum tube rectifiers discussed, commence to conduct in the reverse direction, at approximately the point at which the applied voltage is reversed. Reverse conduction, however, does not result in any appreciable loading to the circuit since the back resistances of the diodes are relatively high.

The above examples of the present invention illustrate the fact that the invention may be carried out in several forms, whether it be by use of thermionic diodes or by means of solid state rectifiers or other types. It should also be noted that the relative polarity of the two rectifying elements, with respect to the alternating signal current supplied, may be reversed. This is true because the devices are effectively operating "class A" with respect to the applied alternating current signal. In this manner, the control voltage in effect establishes the average operating point of the rectifiers, and the applied signal voltage causes a voltage swing about this point. In general, the observed distortion of the signal is quite low and the alternating signal voltage causes very little change in the average operating point.

It should also be noted that the illustrative thermionic diode circuits, while possessing rather substantial positive voltage values, do not in fact provide substantial forward biases as measured at the rectifier terminals. This apparent variance arises from principally thermal effects and is permitted by the large amounts of resistance inserted in series with the bias source.

In both semiconductor and vacuum type rectifiers and rectifiers in general, curvature of the conduction characteristic is usually quite pronounced in the region of zero bias. This general region of operation is preferred. Furthermore, since appreciable positive bias causes rather sharp increases in current with detrimental loading to associated control voltage circuitry, this region is preferably avoided or at most just slightly entered. The small negative bias region is thus preferred since little loading occurs and the conduction characteristic, as noted, is sufficiently curved to provide excellent control.

While particular embodiments of the invention have been shown and described, it should be understood that the invention is not limited thereto, and it is intended in the appended claims to claim all variations which fall within the true spirit of the present invention.

What we claim as new and desire to secure by Letters Patent of the United States is:

1. A signal transmission network having a voltage controlled transfer function comprising first and second rectifying devices each having a non-linear conduction characteristic, means for applying an input alternating current signal of small amplitude to both said rectifying devices in series, said amplitude being normally restircted to values insufficient to cut off said rectifying devices means for deriving an output alternating current signal connected across one of said devices, and means for controlling the ratio between the average potential difference across said first device relative to the average potential difference across said second device to control the relative operating positions of said devices upon their respective conduction characteristics and thereby control said transfer function.

2. A signal transmission network having a voltage controlled transfer function comprising first and second rectifying devices each having a non-linear conduction characteristic, means for applying an input alternating current signal of small amplitude to both said rectifying devices in series, said amplitude being normally restricted to values insufficient to cut off said rectifying devices means for deriving an output alternating current signal connected across one of said devices, means for controlling the ratio between the average potential difference across said first device relative to the average potential difference across said second device to control the relative operating positions of said devices upon their respective conduction characteristics and thereby control said transfer function, and means for establishing said average potential differences in the region of near zero voltage and principally in the portion of said region having an inverse bias.

3. A signal transmission network as set forth in claim 2, wherein said rectifier is a semiconductor diode.

4. A signal transmission network having a voltage controlled transfer function comprising first and second thermionic rectifying devices each having a non-linear conduction characteristic, means for applying an input alternating current signal of small amplitude to both said rectifying devices in series, said amplitude being normally restricted to values insufficient to cut off said rectifying devices means for deriving an output alternating current signal connected across one of said devices, means for controlling the ratio between the average potential difference across said first device relative to the average potential difference across said second device to control the relative operating positions of said devices upon their respective conduction characteristics and thereby control said transfer function, and means for establishing said average potential differences in the lower extremity of the forward conduction characteristics of said rectifying devices.

5. A signal transmission network having a voltage controlled transfer function comprising first and second thermionic rectifying devices each having a nonlinear conduction characteristic, means for applying an input alternating current signal of small amplitude to both said rectifying devices in series, said amplitude being normally restricted to values insufficient to cut off said rectifying devices means for deriving an output alternating current signal connected across one of said devices, means for simultaneously adjusting the average potential difference across said first device and across said second device in opposite senses to control the relative operating positions of said devices upon their respective conduction characteristics and thereby adjust said transfer function, and means for establishing said average potential differences principally in the region of said conduction characteristic characterized by forward conduction in the presence of a small inverse average voltage.

6. A signal transmission network having a voltage controlled transfer function comprising first and second rectifying devices, each having a non-linear conduction characteristic and having terminals of a first and second conduction type respectively, an alternating current signal input circuit for applying an input signal of small amplitude to both said devices in series with said alternating current signal being applied between terminals of said first conduction type respectively, and the respective terminals of said second conduction type being connected together, means for deriving an output alternating current signal connected across one of said devices, means for applying a first direct potential across said first device, means for applying a second direct potential across said second device, and means to control the ratio between said direct potentials to control said transfer function.

7. A signal transmission network having a voltage controlled transfer function comprising first and second rectifying devices, each having a non-linear conduction characteristic and having terminals of a first and second conduction type respectively, an alternating current signal input circuit for applying an input signal of small amplitude to both said devices in series with said alternating current signal being applied between a terminal of the first conduction type of one device and a terminal of the second conduction type of said second device, the remaining dissimilar terminals of said devices being joined, means for deriving an output alternating current signal connected across one of said devices, means for applying a first direct potential across said first device, means for applying a second direct potential across said second device, and means to control the ratio between said direct potentials to control said transfer function.

References Cited in the file of this patent

UNITED STATES PATENTS 2,676,250 Trousdale ............. Apr. 20, 1954

FOREIGN PATENTS 838,906 Germany ............. May 12, 1952